United States Patent [19]

Maeda et al.

[11] Patent Number: 5,624,268
[45] Date of Patent: Apr. 29, 1997

[54] ELECTRICAL CONNECTORS USING ANISOTROPIC CONDUCTIVE FILMS

[75] Inventors: Ryu Maeda, Urawa; Akira Tateishi, Hachioji; Shunsuke Tazai, Fuchu, all of Japan

[73] Assignee: The Whitaker Corporation, Wilmington, Del.

[21] Appl. No.: 590,078

[22] Filed: Jan. 17, 1996

Related U.S. Application Data

[63] Continuation of Ser. No. 336,138, Nov. 8, 1994, abandoned.

[30] Foreign Application Priority Data

Nov. 10, 1993 [JP] Japan ................................ 5-304787

[51] Int. Cl.$^6$ .................................................. H01R 9/09
[52] U.S. Cl. .................................... 439/66; 439/91
[58] Field of Search ............................ 439/66, 91, 591

[56] References Cited

U.S. PATENT DOCUMENTS

| | | | |
|---|---|---|---|
| 3,541,222 | 11/1970 | Parks et al. | 439/66 |
| 3,880,486 | 4/1975 | Avakian | 439/66 |
| 4,548,451 | 10/1985 | Benarr et al. | 439/66 |
| 5,163,834 | 11/1992 | Chapin et al. | 439/66 |
| 5,265,329 | 11/1993 | Jones et al. | 439/66 |

FOREIGN PATENT DOCUMENTS

| | | |
|---|---|---|
| 3-289010 | 12/1991 | Japan . |
| 4-51476 | 2/1992 | Japan . |
| 4-109568 | 4/1992 | Japan . |

Primary Examiner—Neil Abrams

[57] ABSTRACT

This invention presents a new anisotropic conductive film for conductive connections, its method of manufacture, and connectors which use the same, which reduces the connection resistance of semiconductor and similar devices, to the circuit substrates, and simultaneously simplifies the repair. Copper foil 2 is bonded on both sides to an electrical insulating film 3. Holes are formed in the copper foil 2 by etching, and through-holes 5 are formed in the aforesaid electrical insulating film 3, using copper foil 2 as a mask for etching. Next, the through-holes 5 are filled with a conductive elastomer 6, and hardened. The copper foil 2 is then etched to form protuberances 4 of elastomer 6 having the same viscosity. The conducting elastomer 6 protuberance 4 on one side makes contact with the semiconductor device pad, while the protuberance 4 on the other side makes contact with the substrate-side pad. A conductive connection is made by pressing both together.

4 Claims, 5 Drawing Sheets

ELECTRICAL CONNECTORS USING ANISOTROPIC CONDUCTIVE FILMS

This application is a Continuation of Application Ser. No. 08/336,138 filed Nov. 8, 1994, now abandoned.

BACKGROUND OF THE INVENTION

1. Field of the Invention

This invention concerns the manufacturing method and connectors used by an anisotropic conductive film which has an electrical conductive region in the direction of its thickness, and no conductivity or extremely low conductivity in its lateral direction.

2. Description of the Prior Art

Methods for installing semiconductor devices directly to circuit substrates conventionally include the wire bonding method, the TAB method, the flip chip method, etc., each of which is used in practice. Recently, there have been many proposals for the use of conductive adhesives such as anisotropic conductive films and anisotropic conductive pastes for bonding.

Conventionally, the conductive particles in anisotropic thermoplastic films and thermosetting films are dispersed, or in electrical insulating films metallic protuberances are formed at uniform intervals. Furthermore, there are also anisotropic conductive pastes in which microscopic conductive particles are dispersed in the thermosetting resin. In bonding applications of either anisotropic conductive films or anisotropic conductive pastes, connections are made by means of contact by the conductive particles between the substrate circuits and the semiconductor electrodes. In material where metallic protuberances are formed, a metallic bond is formed by means of metallic alloying between the metallic bulges and the electrodes, thereby making electrical contact.

These prior art approaches do however present certain problems which the instant invention solves.

In the above-mentioned anisotropic conductive film bonding method, conductivity was determined by contact made by the randomly-dispersed metallic particles in the film. The quantity of metallic particles contained in the resin film to create anisotropy, however, was limited. As a result, the number of contact points between the metallic particles becomes fewer, with the drawback of a high contact resistance of 1–10 ohms when anisotropic conductive films were used. Moreover, since a great deal of pressure and heat must be applied to the thermosetting resins and thermoplastic resins in the bond-hardening method for conductor connections, a thermo-compression machine is required.

Furthermore, once the adhesive connections are made, some material remains after reheating to peel off the adhesive. Scraping this material off is inconvenient and repairs present a problem.

In the method where metallic protuberances are formed at regular intervals in insulating films, since there are insulating devices between the regularly-spaced metallic protuberances, there is no need to worry about shorts with the adjacent circuit(s) when conductors are connected. Many contact points are available, and it is thus possible to reduce the connection resistance. However, in order to achieve a stable electrical contact using this method, high temperature heating and pressure are necessary to make alloyed connections between the metal bulge and the semiconductor or substrate electrodes, and so on. This requires special equipment. There is also the problem of damaging the semiconductor devices when put under pressure, as well as breaking circuit connections within the substrate itself. It is also very difficult to repair parts that have been connected according to this method.

SUMMARY OF THE INVENTION

The invention presented herein proposes a new connection material and the method to manufacture it. The aim of the invention is to simplify the connections when mounting semiconductor devices or packaged mountings of semiconductors and circuit substrates to make conductive connections between the microscopic electrode connections of printed substrates. Moreover, the connection has a low resistance value. Furthermore, should the connections be defective, the connected parts are easily replaced in order to facilitate repair.

This invention comprises an electrical insulating film in which multiple through-holes are formed to uniform depth in both surfaces. In this electrical insulating film, upon filling the aforementioned through-holes, multiple conductive elastomers of uniform dimensions protrude from both surfaces of the aforementioned electrical insulating film.

Further, an anisotropic conductive film and its method of manufacture are presented in which a foil which can be etched on both sides is bonded to an electrical insulating film of uniform thickness forming multiple through-holes in both surfaces of the aforementioned electrical insulating film. The through-holes are filled with conductive elastomers and etching is used to remove the aforementioned foil.

Moreover, a connector using a film-form anisotropic conductive film is presented which is provided with an electrical insulating film having multiple through-holes formed on both surfaces to an uniform depth and multiple conductive elastomers of uniform dimensions which protrude from both surfaces of the aforementioned electrical insulating film when the aforementioned through-holes are filled, and having the characteristic of pressfitted interconnections between semiconductor devices, and similar devices having multiple electrode substrates formed into connector pads.

In the connection of semiconductors or semiconductor-mounted packages to substrates, this invention enables low temperature connections without the flux used in conventional soldering, etc., by the insertion of an anisotropic conductive film formed with protuberances which have both flexibility and conductivity in the conductive connection members. The attaching structure of the invention enables the effortless replacement of parts when the connection is faulty.

DESCRIPTION OF THE DRAWINGS

Embodiments of the invention will now be described by way of example with reference to the accompanying drawings in which:

FIGS. 12 and 13 are cross sectional views of a semiconductor device being electrically connected with a substrate via an anisotropic conductive film of this invention.

DETAILED DESCRIPTION OF THE PREFERRED EMBODIMENT

Figure 1:
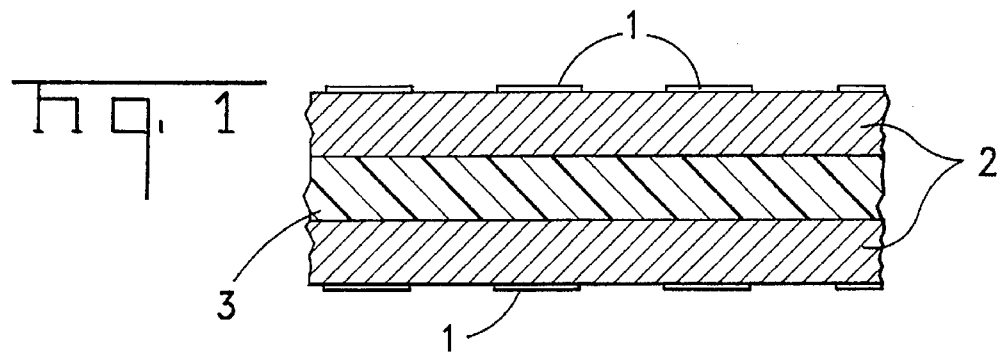
FIGS. 1–5 are cross sectional views of anisotropic conductive film showing one production sequence for the anisotropic conductive film of this invention.

Uniformly-spaced as well as random throughholes are made in the electrical insulating film of this anisotropic conductive film. These through-holes are shaped so that when they are filled with a conductive elastomer, the conductive elastomer protrudes from both surfaces of the insulating film. The conductive elastomer used is a silicone resin in which metal powder is dispersed.

When mounting semiconductors with this invention, after adjusting the positions of the substrate and semiconductor electrode pads with the anisotropic conductive film sandwiched between them, the electrical connections are made by means of the conductive elastomer and applying pressure or adhesive. By using elastomers to make a pressure connection, the areas which make initial contact will deform, enabling compression beyond uniform loading on each pad so that all pads furnish a stable contact resistance. Furthermore, since the electrical connections are made by means of direct contact, the semiconductors can easily be removed from the substrate when the pressure is released.

The following is a detailed description of the manufacturing process of the anisotropic conductive film.

Electric insulator films can be either organic or inorganic. However, the use of a organic polyamide film is desirable, as is the use of a copper layer bonded to both sides. Holes of uniform shape (for example, round holes) are made in both sides, or from one side, by means of etching. Afterwards, the polyamide film is etched by alkali etching with a copper foil mask, creating a copper-polyamide-copper three-layer structure. The diameter of the holes varies according to the connection pattern, they can be anywhere from several tens of microns to several millimeters in width.

By electroplating the throughholes after making the holes in both surfaces, the conductive resin's resistance in this area can be ignored, affording good connection resistance when the film is used as a film connector.

The opened holes are filled with conductive silicone rubber. For the conductive silicone rubber any of the following additives to the cast liquid silicone resin can be considered: gold, silver, copper, nickel, palladium, or their alloys; or any of these with organic or inorganic plating; or metal particles plated with a precious metal. While the above can be manufactured by electrolysis, reduction, grinding, atomizing, and other adequate methods, in light of the hole size in the film, a small particle diameter powder is desirable.

Further, any material with elastomeric properties of conductivity may be used, apart from the conductive particles dispersed in the silicone resin.

The desirable methods for filling the film holes with conductive resin include a printing method, a doctor blade method, etc., as methods of filling with resin. The resin is removed from all areas with the exception of the film holes, only the resin filling is heat cured, and the film hole conductive elastomers are formed.

The copper on the film surface is removed by etching, and conductive elastomers are formed from the bulges protruding from the surface of the insulating film.

By plating these protuberances with a precious metal, it is possible to reduce the contact resistance and to obtain a more stable contact. After activation processing and thoroughly washing with water, it is best that the entire film be plated with nickel and then with gold. In particular, since the gold coating is on top a coating of nickel, it is possible to prevent silver migration when silver powder is used on the conductive resin.

The thus gold-plated elastomers protruding from the surface are then plated with silver powder. When used as a connector, a gold-plated protuberance several microns high forms. When pressed against the mating electrode, the microscopic protuberances are incorporated throughout the mating side metal, creating a wiping effect which stabilizes the contact resistance at one level.

Since this invention makes use of castable liquid silicone, the protuberances themselves have elasticity. Due to the optimization of the powder by kneading, a low resistance high conductivity is attained.

By providing throughholes in an insulating film and microscopically dispersing conductive elastomers, this invention can be used not only as a conductive connector for semiconductor devices and a conductive connector for semiconductor packages, but also as a connector for making connections in fine-pitch (high density) circuit boards. Moreover, while anisotropic conductive films have been conventionally used for circuit connections in liquid crystal displays, the use of the anisotropic conductive film as described in this invention will reduce the connection resistance and solve the problems of connector area short circuits and repairability.

Figure 2:
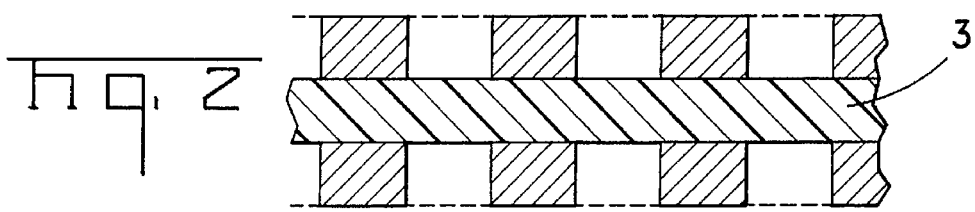
Figure 3:
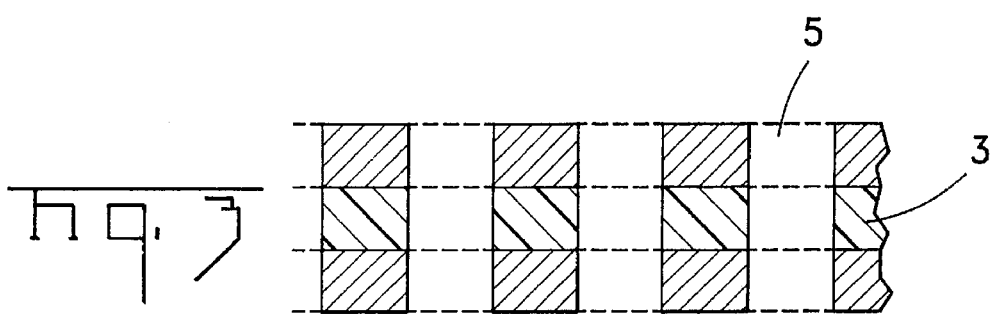
Figure 4:
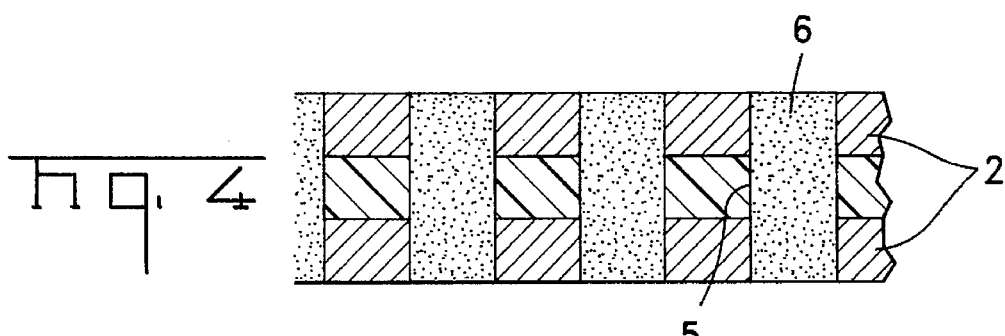

An example of this invention will be described below, referring to the drawings. FIGS. 1 through 9 show the anisotropic conductive film manufacturing method, where a film consisting of a 25 µm polyamide film 3 without adhesive on its surface is formed with a 17 µm copper foil 2. As shown in FIG. 1, a resist 1 is formed in order to make 50 µm diameter holes (through-holes 5) in the film. As shown in FIG. 2, a ferric chloride solution is used to etch the copper foil 2; and, as shown in FIG. 3, the polyamide film 3 is etched with a strong alkali in order to form the throughholes 5.

using the doctor blade method, the throughholes in the film described above are filled with a conductive silicone resin 6, consisting of extremely low impurity silver powder kneaded into a castable liquid silicone resin, as shown in FIG. 4. The film is held for 30 minutes at 85° C. in an oven, forming thus a conductive elastomer material in the throughholes 5.

Figure 5:
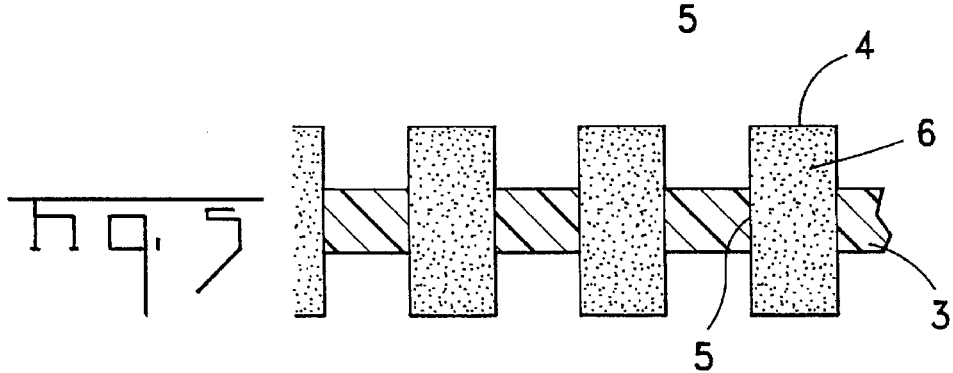

The film surface is lightly burnished with sandpaper or similar material and then immersed in a ferric chloride solution in order to dissolve the copper 2 by etching from both sides, and forming conductive elastomer protuberances 4 over the entire surface of the film, as shown in FIG. 5.

The film is cut at a 20 mm square and, as shown in FIG. 13, is interposed between a 20 mm square semiconductor device 10 and a substrate 13 on which the semiconductor device 10 is to be mounted. A pressure of 2 kg/cm² is applied on the device from above, and an electrical connection mounted structure is thus achieved. Conductivity evaluations were done of semiconductor device 10 with electrodes 9 having a diameter of 200 µm, in a square pattern, with three herringbone rows on each side, with 114 elements each, for a total of 456 electrode elements.

Figure 10:
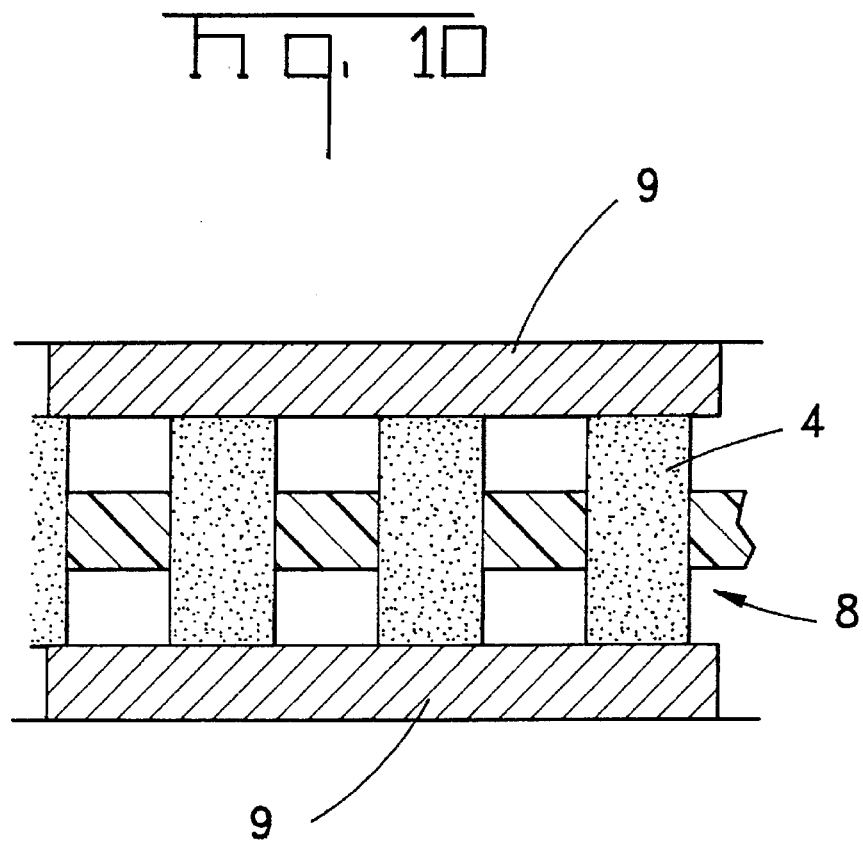
FIG. 10 is a cross sectional view of electrode joining using the anisotropic conductive film of this invention.

Connection was made, as shown in FIG. 10, between electrodes 9 having a diameter of 200 µm, and the anisotropic conductive film 8 with protuberances 4 having a 50 µm diameter with a pitch of 100 µm. A minimum of seven protuberances 4 made contact with each electrode 9.

Using a milli-ohmmeter and the four terminals method, the connection resistance of the 456 pads of the above-mentioned substrate was measured. The maximum resistance was 35 mΩ, minimum, 12 mΩ, with an average of 16 mΩ. There was not a single poor contact. Moreover, adjacent electrodes were satisfactorily insulated, as absolutely no short circuits were observed.

Figure 6:
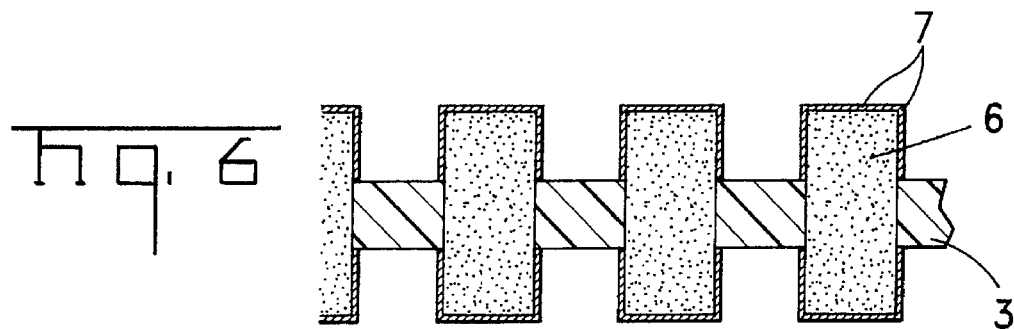
FIG. 6 is a cross sectional view of the elastomer protuberances with gold plating.

The polyamide film with elastomer protuberances in Example 1 is cut in 20 mm squares after being immersed for one minute in an activating compound produced by Kôjundo Chemical Industries, and as shown in FIG. 6, a gold plating layer 7 of 0.3 μm was formed. As with Example 1, semiconductor device 10 was mounted and connection resistance between the electrodes was measured.

The resulting resistance had a maximum value of 15 mΩ, a minimum of 8 mΩ, with an average resistance of 10.5 mΩ. There was not a single poor contact. Moreover, adjacent electrodes were satisfactorily insulated, as absolutely no short circuits were observed.

Figure 7:
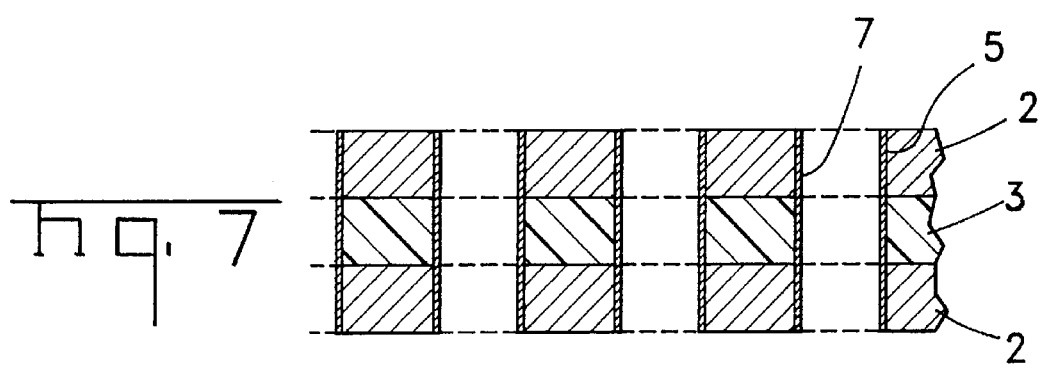
FIGS. 7–9 are cross sectional views showing the plated inner walls of the through-holes in the polyamide film and gold plating of the sides of the protuberances.
Figure 8:
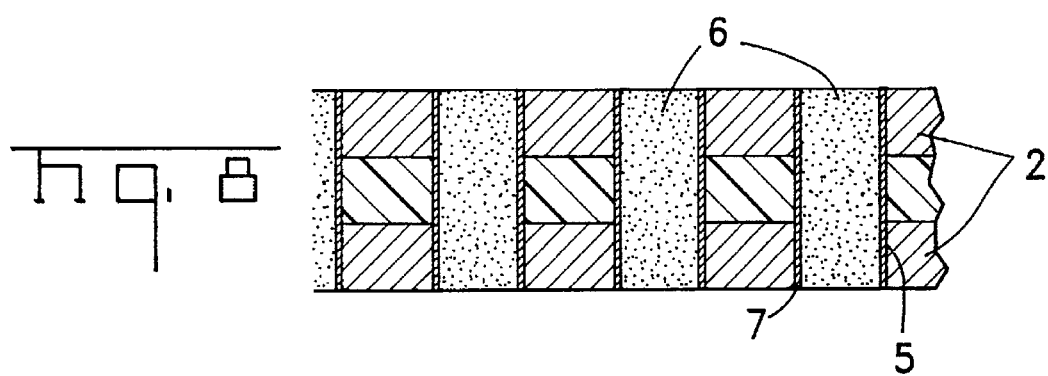
Figure 9:
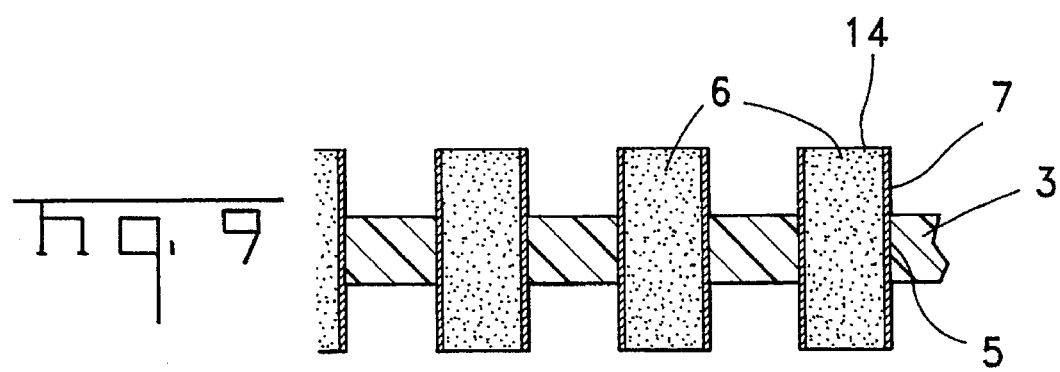

In the manufacturing procedure for the anisotropic conductive film in Example 1, after forming the holes in a film copper covered on both sides, the inner surfaces of the holes are plated with a layer of gold 7 as shown in FIG. 7. As seen in FIGS. 8 and 9, the sides of the conductive silicone resin 6 also have a layer of gold plating 7, forming the protuberances 14. Exactly as in Example 1, a semiconductor device 10 was mounted and the connection resistance between the electrodes was measured.

The resulting resistance had a maximum value of 13 mΩ, a minimum of 4 mΩ, with an average resistance of 8.5 mΩ. There was not a single poor contact. Moreover, adjacent electrodes were satisfactorily insulated, as absolutely no short circuits were observed.

Figure 12:
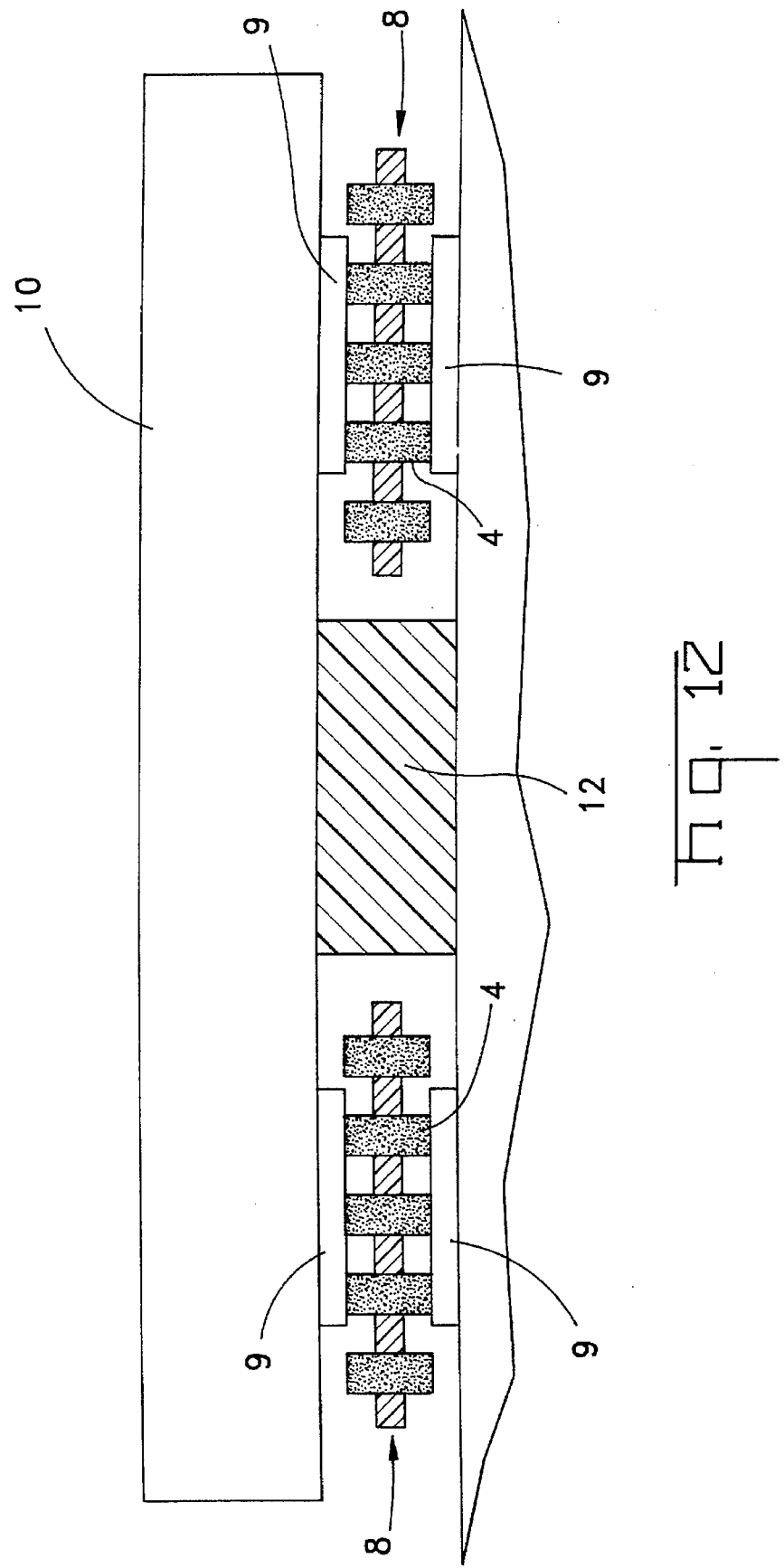
Figure 17:
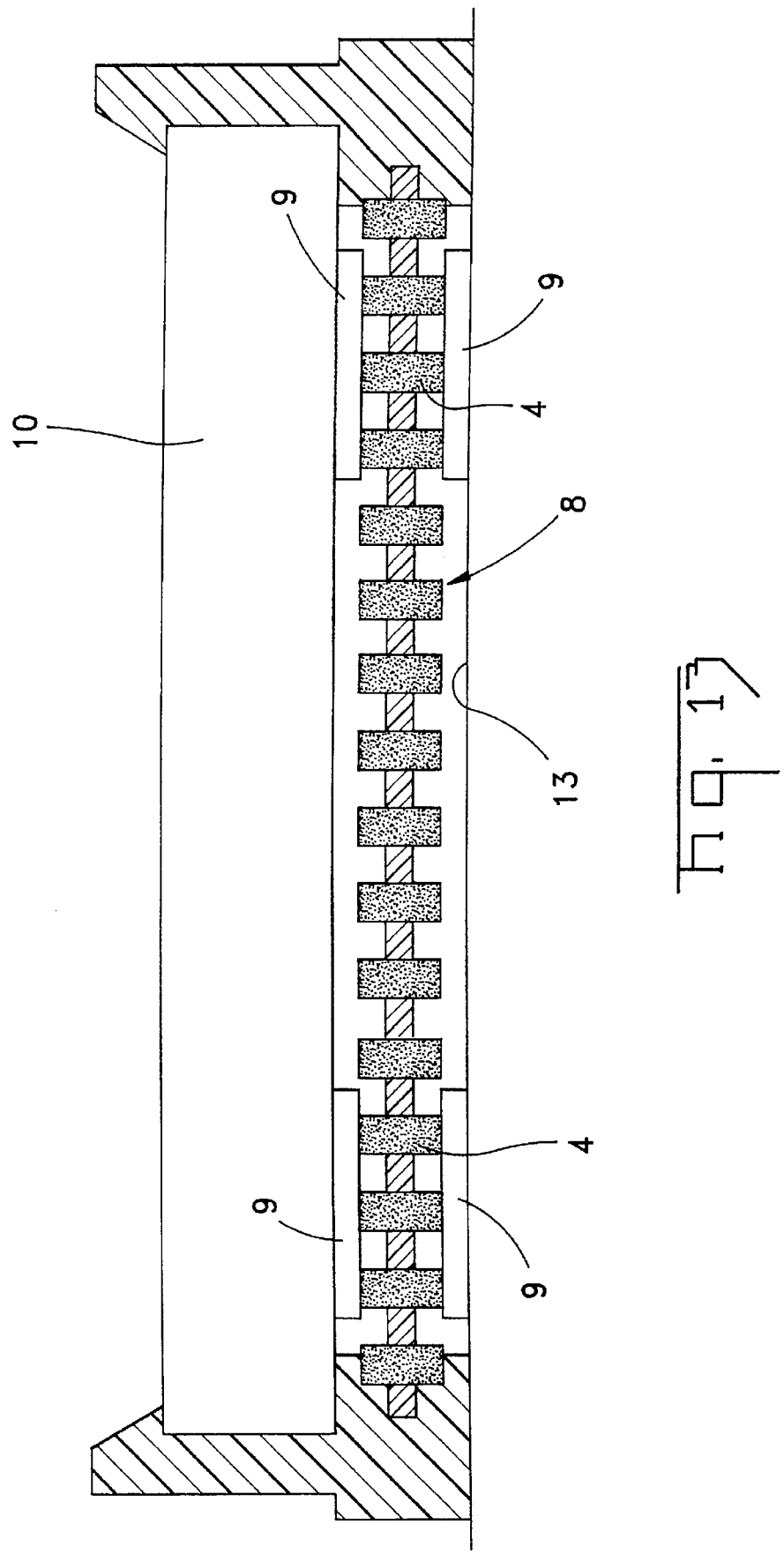

A hole made of 10 mm square is made at the center of the 20 mm square anisotropic conductive film 8 produced with conductive elastomer protuberances in Example 1. As shown in FIG. 12, when mounting the semiconductor devices a 10 mm-square thermocompression bonding sheet 12 is bonded and heated to 180° C. to achieve thermocompression bonding. In this connection method, the semiconductor pressing mechanism in Examples 1 through 3 is not necessary, and the mounting area is identical to the area of the semiconductor itself. Moreover, in the event of a poor connection, it is possible to heat and remove the device, and since here the adhesive does not adhere to the conductive connection area electrodes 9, the connection can be suitably repaired.

After bonding, the conduction resistance had a maximum value of 30 mΩ, a minimum of 17 mΩ, with an average resistance of 22 mΩ. There was not a single poor contact. Moreover, adjacent electrodes were satisfactorily insulated, as absolutely no short circuits were observed.

A commercially-available bonding type anisotropic conductive film was cut in at a 20 mm squares, and a semiconductor was mounted on the substrate described in Example 1. It was heated to 140° C., compressed to 20 kg/cm², and the semiconductor devices were connected. Using the same procedure as in Example 1, when the connection resistance between the substrate and the devices was measured, the maximum resistance was 980 mΩ, the minimum was 820 mΩ, for an average of 915 mΩ. Furthermore, there was not a single poor contact. Moreover, adjacent electrodes were satisfactorily insulated, as absolutely no short circuits were observed.

Figure 11:
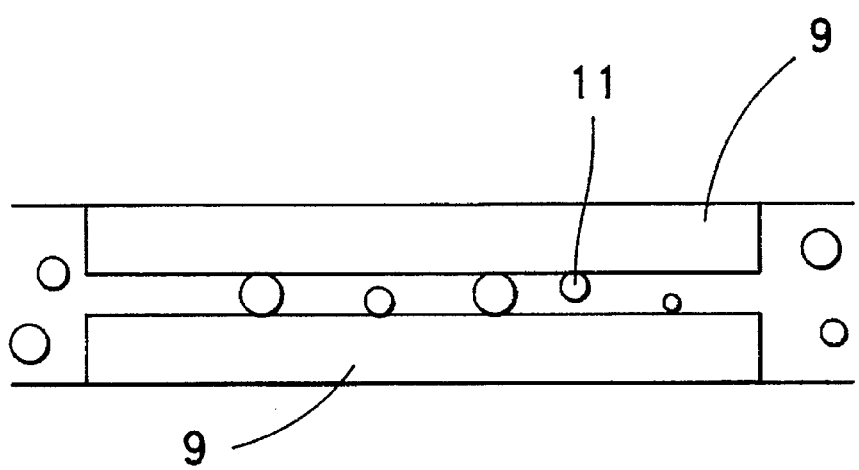
FIG. 11 is a cross sectional view of electrode joining using conventional anisotropic conductive film.

Furthermore, by cutting the electrode pad of the bonded semiconductor and inspecting the cross section, it was observed that no more than a few of the particles 11 were making conductive contact between the electrodes 9, as can be seen in FIG. 11.

The anisotropic conductive film obtained by this invention forms elastic conductive elastomer protuberances of uniform dimension which protrude from the surface of the electrically insulating film. Therefore, the connection pressure as well as connection resistance are low. Since the conductive elastomer can be used in paste form, microshaping of the protuberances is possible. Further, as the protuberance surfaces as well as the inner surfaces of the holes in the film are not electroplated, even lower connection resistance, in other words a low connection resistance connector, can be obtained.

By inserting a film-type connector between the electrodes and using pressure, stable connection resistance can be obtained. Moreover, none of the problems associated with the use of heat and flux for soldering occur. Since the contact is effected by means of compression, it can freely by removed. Therefore, in the conducting connections for miniature semiconductor packages, like ICs and similar devices, and substrates, as well as for FPCs, TABs, substrates, and similar devices, these fine pitch multi-point connections offering the capability to repair the connections make the use of high-density mounted circuit substrates possible.

We claim:

1. An electrical connector for electrically interconnecting conductive pads of electrical circuit members, said electrical connector comprising:

an insulating member having multiple throughholes;

conductive elastomer members filled with conductive particles, each conductive elastomer member having a portion disposed in one of said throughholes and protruding outwardly from upper and lower surfaces of said insulating member so that outer surfaces of said conductive elastomer members are located in planes parallel to said insulating member whereby a number of the conductive elastomer members engage aligned conductive pads of the electrical circuit members; and a coating of precious metal covering substantially all surfaces of said conductive elastomer members except that the portion of each conductive elastomer member located within its associated throughholes is substantially uncoated.

2. An electrical connector as claimed in claim 1, wherein said precious metal is gold.

3. An electrical connector for electrically interconnecting conductive pads of electrical circuit members, said electrical connector comprising:

an insulating member having multiple throughholes;

conductive elastomer members filled with conductive particles and disposed in said throughholes and protruding outwardly from upper and lower surfaces of said insulating member so that outer surfaces of said conductive elastomer members are located in planes parallel to said insulating member whereby a number of the conductive elastomer members engage aligned conductive pads of the electrical circuit members; and a coating of precious metal covers substantially all surfaces of said conductive elastomer members except said outer surfaces thereof and also covers said throughholes.

4. An electrical connector as claimed in claim 3, wherein said precious metal is gold.

* * * * *